United States Patent [19]

Mochizuki

[11] Patent Number: 4,965,480

[45] Date of Patent: Oct. 23, 1990

[54] SURFACE ACOUSTIC WAVE CONVOLVER WITH TWO OUTPUT ELECTRODES OF DIFFERENT LENGTHS

[75] Inventor: Norihiro Mochizuki, Yokohama, Japan

[73] Assignee: Canon Kabushiki Kaisha, Tokyo, Japan

[21] Appl. No.: 292,241

[22] Filed: Dec. 30, 1988

[30] Foreign Application Priority Data

Jan. 12, 1988 [JP] Japan .................................. 63-3211

[51] Int. Cl.[5] .............................................. H01L 41/08

[52] U.S. Cl. ................................ 310/313 D; 364/821

[58] Field of Search ........... 310/313 R, 313 B, 313 D; 364/821; 333/150, 151, 153, 193–195

[56] References Cited

U.S. PATENT DOCUMENTS 4,097,900 6/1978 Moulin et al. .............. 310/313 B X
4,675,839 6/1987 Kerr .................................... 364/821
4,799,184 1/1989 Grassl .................................. 364/821
4,841,470 6/1989 Okamoto et al. ................... 364/821

FOREIGN PATENT DOCUMENTS 62-060466 3/1987 Japan .
62-220489 9/1987 Japan .

*Primary Examiner*—Mark O. Budd
*Attorney, Agent, or Firm*—Fitzpatrick, Cella, Harper & Scinto

[57] ABSTRACT

A surface acoustic wave convolver comprises:

a piezoelectric substrate:

plural input transducers formed on the substrate and adapted for respectively generating a surface acoustic wave corresponding to an input signal; and an output transducer for interferring thus generated surface acoustic wave and obtaining a convolution signal of the input signal from a surface wave generated by thus interfered surface acoustic wave, wherein the output transducer is formed by first and second output electrodes provided in parallel manner between the input transducers and having mutually different lengths along the propagating direction of the surface acoustic wave.

6 Claims, 2 Drawing Sheets

SURFACE ACOUSTIC WAVE CONVOLVER WITH TWO OUTPUT ELECTRODES OF DIFFERENT LENGTHS

BACKGROUND OF THE INVENTION

1. Field of the Invention

The present invention relates to a surface acoustic wave convolver for obtaining a convolution output utilizing non-linear interaction of plural surface acoustic waves.

2. Related Background Art

The surface acoustic wave convolver has become important as a key device in diffused or spread spectrum communication. Also various researches are being made for the application as a real-time signal processing device. For example the present inventors made a proposal for improving the efficiency of such convolver in the Japanese Patent Application No. 62-60466 and the Japanese Patent Application No. 62-220489 corresponding to the U.S. patent application Ser. No. 167,254.

FIG. 1 is a schematic view of a conventional surface acoustic wave convolver.

On a piezoelectric substrate 1, there are formed a pair of interdigital electrodes 2, and a central electrode 3 positioned therebetween. The interdigital electrodes are used for generating surface acoustic waves corresponding to input signals, while the central electrode 3 is used for propagating the surface acoustic waves generated by the interdigital electrodes in mutually opposite directions and for obtaining the output signal.

When signals $F(t)e^{j\omega t}$ and $G(t)e^{j\omega t}$ are respectively supplied to one and the other of the interdigital electrodes 2, two surface acoustic waves:

$$F\left(t-\frac{x}{v}\right)e^{j\omega(t-\frac{x}{v})} \text{ and } G\left(t-\frac{L-x}{v}\right)e^{j\omega(t-\frac{L-x}{v})}$$

propagate in mutually opposite directions on the surface of the piezoelectric substrate 1, wherein v is the velocity of said acoustic waves, and L is the length of the central electrode 3.

On the propagation path, there is generated a component representing the product of said surface acoustic waves due to the non-linear effect, and said component is integrated within the central electrode 3 and is taken out to provide an output signal H(t):

$$H(t) = \alpha \cdot e^{j2\omega t}\int_0^L F\left(t-\frac{x}{v}\right)\cdot G\left(t-\frac{L-x}{v}\right)dx$$

wherein $\alpha$ is a proportional coefficient.

In this manner there can be obtained F(t) and G(t) from the central electrode 3.

In the above-explained conventional structure, however, when the signal emitted from either interdigital electrode 2 reaches the other or interdigital electrode through the central electrode 3, a part of said signal is reflected and again reaches the central electrode 3. Thus the signal emitted from the first-mentioned electrode 2 is superposed with the signal reflected from the other comb-shaped or digital electrode 2 on the central electrode 3, thus generating convolution as explained above. Such phenomenon is called self-convolution.

In this manner the prior technology has been associated with a drawback that an unnecessary signal resulting from such self-convolution overlaps with the desired convolution signals.

SUMMARY OF THE INVENTION

The object of the present invention is to provide a surface acoustic wave convolver free from the above-mentioned drawbacks of the prior technology and capable of suppression of the self-convolution with a simple structure.

The foregoing object can be achieved, according to the present invention, by a surface acoustic convolver comprising:

a piezoelectric substrate;

plural input transducers formed on said substrate and adapted for respectively generating a surface acoustic wave corresponding to an input signal; and an output transducer for interfering thus generated surface acoustic wave and obtaining a convolution signal of said input signal from a surface wave generated by thus interfered surface acoustic wave, wherein said output transducer is formed by first and second output electrodes provided in parallel manner between said input transducers and having mutually different lengths in a direction along the propagating direction of said surface acoustic wave.

Due to the presence of such first and second output electrodes of mutually different lengths, the signal emitted from an input transducer and transmitted by the first output electrode and that transmitted by the second output electrode have mutually different phases. These signals therefore dissipate each other on the other input transducer, thereby suppressing the generation of reflected wave and eventually suppressing the self-convolution phenomenon.

DETAILED DESCRIPTION OF THE PREFERRED EMBODIMENTS

Now the present invention will be clarified in detail by embodiments thereof shown in the attached drawings.

Figure 1:
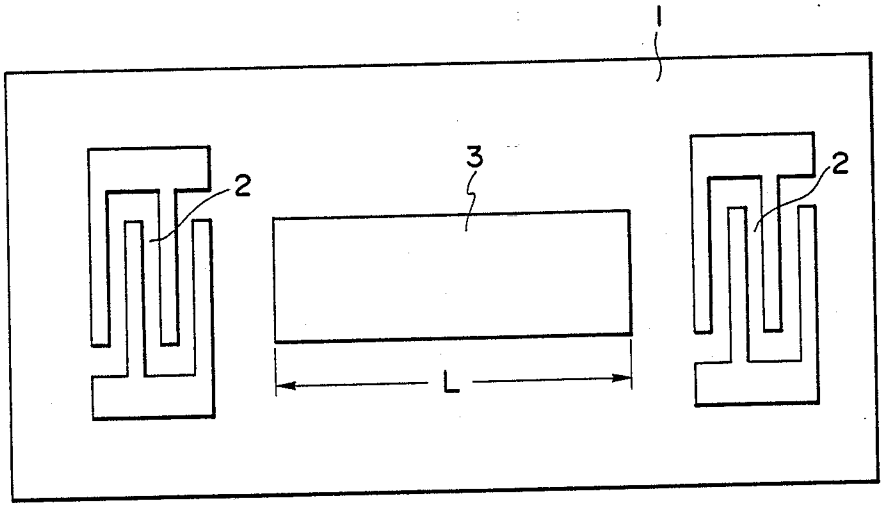
FIG. 1 PRIOR ART
FIG. 1 is a schematic view of a conventional surface acoustic wave convolver.
Figure 2:
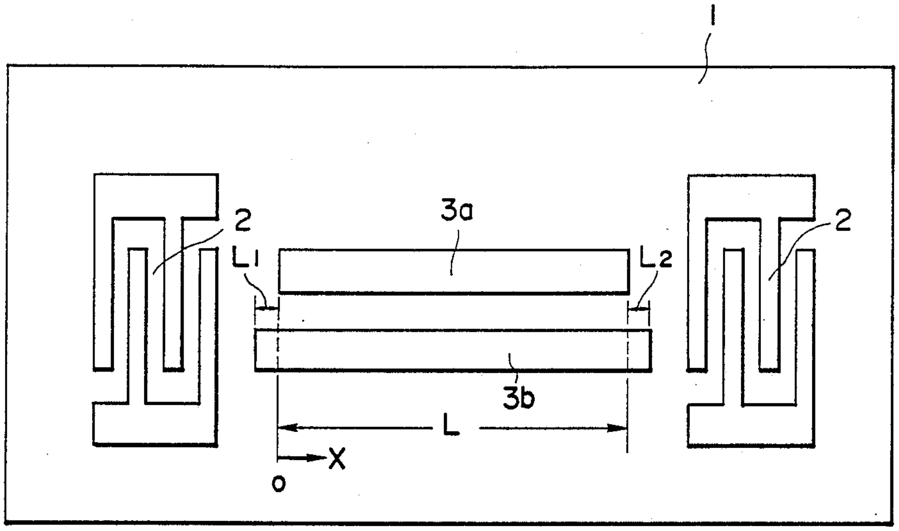
FIG. 2 is a schematic view of a surface acoustic wave convolver constituting a first embodiment of the present invention.

FIG. 2 is a schematic view of a surface acoustic wave convolver constituting a first embodiment of the present invention.

In FIG. 2, interdigital electrodes 2 and central electrodes **3*a*, 3*b* are formed, usually by a photolithographic process, on a piezoelectric substrate 1**.

These interdigital electrodes 2 constitute input transducers, while the central electrodes **3*a*, 3*b*** constitute the output transducer.

Said central electrodes **3*a*, 3*b* are formed in mutually parallel manner along the direction of propagation of the surface acoustic wave emitted from the interdigital electrode 2, and the electrode 3*b* is longer than the electrode 3*a*** by $\Delta L = L_1 + L_2$.

The piezoelectric substrate 1 is composed for example of lithium niobate ($LiNbO_3$), while the electrode 2, 3a, 3b are composed of a conductive material such as aluminum, silver or gold.

When the surface of the piezoelectric substrate 1 is covered by a conductive material, the speed of the surface acoustic wave becomes lower than that on the free surface, due to an elastic stiffening effect or a mass load effect. This phenomenon can be utilized to obtain a phase difference of 180° between the surface acoustic waves respectively transmitted by the central electrodes 3a and 3b, by suitable selection of the difference ΔL in the lengths of said central electrodes. This will be explained in detail in the following.

At first the difference ΔL in the lengths of the central electrodes 3a, 3b is determined as follows:

$$\Delta L \cdot \left(\frac{1}{v_m} - \frac{1}{v_o}\right) = \left(n + \frac{1}{2}\right) \cdot \frac{1}{f} \quad (1)$$

wherein $v_m$ is the velocity of the surface acoustic wave on the surface covered with a conductive material, $v_0$ is said velocity on a free surface, f is the central frequency of the input signal, and n is an integer.

For a difference ΔL in length satisfying the equation (1), the surface acoustic wave generated in an interdigital electrode 2 generates a phase difference while being transmitted by the central electrodes 3a and 3b, so that the wave transmitted by the central electrode 3a and that transmitted by the central electrode 3b show a mutual phase difference of 180° upon arriving at the other interdigital electrode. Said waves are therefore dissipated by the fingers constituting said the other interdigital electrode, and do not generate the reflected wave resulting from regeneration. It is therefore rendered possible to suppress the self-convolution phenomenon in the prior technology.

Said electrode fingers may also be constructed as double electrode structure to increase the suppressing effect for the reflected wave, thereby improve the performance as the convolver.

For more detailed explanation, the x-axis is taken in a direction toward right in FIG. 2, with the starting point (x=0) at the left-hand end of the central electrode 3a.

Then, two surface acoustic waves propagating in mutually opposite directions through the central electrode 3a are represented as follows:

$$F\left(t - \frac{x}{v_m}\right)e^{j\omega(t - \frac{x}{v_m})} \text{ and } G\left(t - \frac{L-x}{v_m}\right)e^{j\omega(t - \frac{L-x}{v_m})} \quad (2)$$

$$\text{wherein } 0 \leqq x \leqq L$$

On the other hand, two surface acoustic waves propagating in mutually opposite directions through the central electrode 3b are represented as follows:

$$F\left(t - \frac{x}{v_m} - \Delta t_1\right)e^{j\omega(t - \frac{x}{v_m} - \Delta t1)} \text{ and} \quad (3)$$

$$G\left(t - \frac{L-x}{v_m} - \Delta t_2\right)e^{j\omega(t - \frac{L-x}{v_m} - \Delta t2)}$$

$$\text{wherein } -L_1 \leqq x \leqq L + L_2,$$

-continued $$\Delta t_1 = \Delta L_1\left(\frac{1}{v_m} - \frac{1}{v_o}\right), \text{ and}$$

$$\Delta t_2 = \Delta L_2\left(\frac{1}{v_m} - \frac{1}{v_o}\right)$$

On the central electrodes 3a and 3b, the overlapping of two surface acoustic waves propagating in mutually opposite directions respectively generates, by the non-linear effect, convolution signals $H_1(t)$ and $H_2(t)$ represented as follows:

$$H_1(t) = \alpha \cdot e^{j2\omega t}\int_0^L F\left(t - \frac{x}{v_m}\right) \cdot G\left(t - \frac{L-x}{v_m}\right)dx$$

$$H_2(t) = \alpha \cdot e^{-j\omega(\Delta t1 + \Delta t2)}e^{j2\omega t}\int_{-L_1}^{L+L_2} F\left(t - \frac{x}{v_m} - \Delta t_1\right) \cdot G\left(t - \frac{L-x}{v_m} - \Delta t_2\right)dx$$

From the equations (1) and (2):

$$\Delta t_1 + \Delta t_2 = \left(n + \frac{1}{2}\right) \cdot \frac{1}{f}$$

and, for $\Delta t_1$ and $\Delta t_2$ sufficiently smaller than the variable range of F(t) and G(t), there stands:

$$H_2(t) \approx -\alpha \cdot e^{j2\omega t}\int_{-L_1}^{L+L_2} F\left(t - \frac{x}{v_m}\right)G\left(t - \frac{L-x}{v_m}\right)dx$$

Thus, since $H_1(t)$ and $H_2(t)$ are mutually different by 180° in phase, the output signal can be taken out as the difference.

Figure 3:
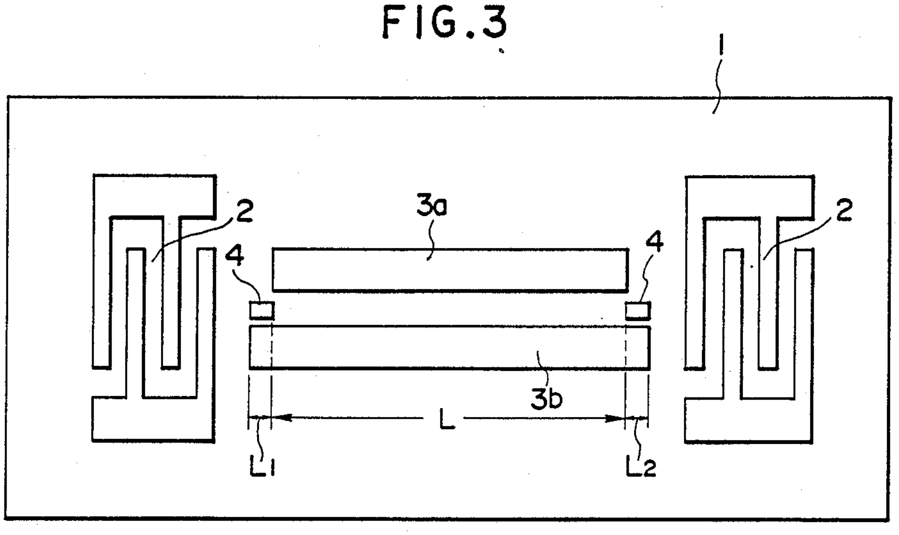
FIG. 3 is a schematic view of a surface acoustic wave convolver constituting a second embodiment of the present invention.

FIG. 3 is a schematic view of a second embodiment of the present invention.

In the present embodiment there are provided auxiliary conductor films 4 in addition to the structure of the first embodiment.

As shown in FIG. 3, the auxiliary conductor film 4 are formed on a propagation path of the surface acoustic wave generated by the interdigital electrode 2, other than the areas of the central electrodes 3a, 3b, and have a width equal to a half of that of said propagation path, and a total length ΔL satisfying the equation (1).

Such auxiliary conductor films 4 generates a phase difference of 180° also for the surface acoustic wave transmitted outside the central electrodes 3a, 3b and arriving at the other interdigital electrode, according to whether the wave passes through the auxiliary conductor films 4 or not, so that the formation of reflected wave can be suppressed.

In this manner the convolver of the present embodiment can further reduce the self-convolution in comparison with the first embodiment, thereby improving the performance.

The position of the auxiliary conductor films is not limited to that shown in FIG. 3 but can be selected in any propagation area of the surface acoustic wave generated from both interdigital electrodes 3, except the propagation paths through the central electrodes *3a*, *3b*. Also said auxiliary conductor film 4 may be divided in plural portions on a same propagation path.

The present invention is not limited to the foregoing embodiments but is subject to various modifications, within the scope and spirit of the appended claims.

I claim:

1. A surface acoustic wave convolver comprising:

a piezoelectric substrate;

plural input transducers formed on said substrate and adapted for respectively generating surface acoustic waves corresponding to input signals; and an output transducer for obtaining a convolution signal of said input signals from a surface acoustic wave generated by non-linear interaction of the surface acoustic waves generated by said input transducers;

wherein said output transducer is formed by first and second output electrodes provided in parallel manner between said input transducers and having mutually different lengths along the propagating direction of said surface acoustic wave; and wherein the difference ΔL in length of said first and second output electrodes substantially satisfies following condition:

$$\Delta L\cdot(1/v_m-1/v_o)=(n+\tfrac{1}{2})\cdot 1/f$$

wherein $V_m$ is the velocity of the surface acoustic wave on the substrate surface covered with said output electrode, $V_0$ is the velocity of the surface acoustic wave on the free surface of the substrate not covered by said output electrode, f is the center frequency of said input signals, and n is an integer.

2. A surface acoustic wave convolver according to claim 1, further comprising an auxiliary conductor film formed on a propagation path other than the area covered by said output electrodes and having a width equal to ½ of the width of said propagation path and a total length ΔL satisfying the foregoing condition.

3. A surface acoustic wave convolver according to claim 1, wherein said input transducer is composed of an interdigital electrode.

4. A surface acoustic wave convolver comprising:

a piezoelectric substrate;

first and second input transducers formed on said substrate and adapted for respectively generating surface acoustic waves corresponding to input signals; and an output transducer for obtaining a convolution signal of said input signals from a surface acoustic wave generated by non-linear interaction of the surface acoustic waves generated by said input transducers;

wherein said output transducer is formed by first and second output electrodes provided in parallel manner between said input transducers and having mutually different lengths along the propagating direction of said surface acoustic wave; and wherein the difference in length between said first and second output electrode is arranged so as to produce the phase difference of 180° between two surfaces acoustic waves which originate from one of said input transducers and arrive at the other input transducer through respective said first and second output electrodes.

5. A surface acoustic wave convolver according to claim 4, further comprising an auxiliary conductor film which is formed on a propagation path of the surface acoustic wave other than the area covered by said output electrodes and is adapted to give, in the surface acoustic wave transmitted in said propagation path, a phase difference between the wave passing through said conductor film and the wave not passing through said conductor film so as to mutually dissipate these waves.

6. A surface acoustic wave convolver according to claim 4, wherein said input transducer is composed of an interdigital electrode.

* * * * *

UNITED STATES PATENT AND TRADEMARK OFFICE

CERTIFICATE OF CORRECTION

PATENT NO. : 4,965,480

DATED : October 23, 1990

INVENTOR(S) : NORIHIRO MOCHIZUKI

It is certified that error appears in the above-identified patent and that said Letters Patent is hereby corrected as shown below:

COLUMN 1

Line 57, "obtained" should read --obtained the convolution signal H(t) of--.
Line 61, "other" should read --other comb-shaped--.

COLUMN 5

Line 31, "$V_m$" should read --$v_m$--.
Line 33, "$V_0$" should read --$v_o$--.

COLUMN 6

Line 23, "second output electrode" should read --second output electrodes--.

Signed and Sealed this

Seventh Day of April, 1992

*Attest:*

HARRY F. MANBECK, JR.

*Attesting Officer* *Commissioner of Patents and Trademarks*